(12) United States Patent
Yamamoto et al.

(10) Patent No.: US 7,811,852 B2
(45) Date of Patent: Oct. 12, 2010

(54) ORGANIC SEMICONDUCTOR DEVICE

(75) Inventors: Yoshiaki Yamamoto, Kanagawa (JP); Takahito Oyamada, Hokkaido (JP); Chihaya Adachi, Hokkaido (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 166 days.

(21) Appl. No.: 12/174,685

(22) Filed: Jul. 17, 2008

(65) Prior Publication Data
US 2008/0277655 A1    Nov. 13, 2008

Related U.S. Application Data

(63) Continuation of application No. 11/277,458, filed on Mar. 24, 2006, now Pat. No. 7,429,823.

(30) Foreign Application Priority Data
Mar. 25, 2005    (JP)    ............... 2005-087893

(51) Int. Cl.
*H01L 51/40* (2006.01)
(52) U.S. Cl. ............... 438/99; 438/623; 257/40; 257/E51.002; 257/E51.024; 257/E21.299; 313/504
(58) Field of Classification Search ............... 438/99, 438/623; 257/40, E51.002, E51.024, E21.299; 313/504
See application file for complete search history.

(56) References Cited

U.S. PATENT DOCUMENTS 5,563,424 A    10/1996    Yang 5,567,550 A    10/1996    Smayling (Continued)

FOREIGN PATENT DOCUMENTS

EP    1246244 A2    10/2002

(Continued)

OTHER PUBLICATIONS

Y. Yoshiaki et al., "Electrical characteristics of a vertical polymer light-emitting transistor with a PEDOT: PSS gate electrode", 29p-YG-13, Extended Abstract (The 52$^{nd}$ Sprint Meeting, 2005); The Japan Society of Applied Physics and Related Societies, Mar. 29, 2005, p. 1500 (with English translation).

*Primary Examiner*—Tu-Tu V Ho
(74) *Attorney, Agent, or Firm*—Fish & Richardson P.C.

(57) ABSTRACT

An organic semiconductor device with a vertical structure having both functions of an organic thin film transistor and light-emitting element, where the electrical characteristics as both the organic thin film transistor and light-emitting element can be controlled in the case of forming a gate electrode with an organic conductive film, and a manufacturing method thereof. The above organic semiconductor device has such a structure that organic semiconductor films are sandwiched between a pair of electrodes functioning as a source electrode and drain electrode of an organic thin film transistor and also functioning as an anode and cathode of a light-emitting element, a thin organic conductive film functioning as a gate electrode is sandwiched between the organic semiconductor films, and a part of the organic conductive film is electrically connected to an auxiliary electrode, thereby the electrical characteristics as both the organic thin film transistor and light-emitting element can be controlled.

24 Claims, 6 Drawing Sheets

U.S. PATENT DOCUMENTS

| | | | |
|---|---|---|---|
| 5,574,291 | A | 11/1996 | Dodabalapur |
| 5,677,041 | A | 10/1997 | Smayling |
| 5,691,089 | A | 11/1997 | Smayling |
| 5,705,826 | A | 1/1998 | Aratani |
| 5,804,836 | A | 9/1998 | Heeger |
| 5,942,374 | A | 8/1999 | Smayling |
| 5,946,551 | A | 8/1999 | Dimitrakopoulos |
| 6,207,472 | B1 | 3/2001 | Callegari |
| 6,300,988 | B1 | 10/2001 | Ishihara |
| 6,326,640 | B1 | 12/2001 | Shi |
| 6,344,662 | B1 * | 2/2002 | Dimitrakopoulos et al. ... 257/40 |
| 6,429,457 | B1 | 8/2002 | Berggren |
| 6,445,126 | B1 | 9/2002 | Arai |
| 6,452,207 | B1 | 9/2002 | Bao |
| 6,509,581 | B1 | 1/2003 | Tsai |
| 6,528,816 | B1 | 3/2003 | Jackson |
| 6,566,714 | B2 | 5/2003 | Deane |
| 6,635,508 | B2 | 10/2003 | Arai |
| 6,815,710 | B2 | 11/2004 | Tsuchida |
| 7,002,176 | B2 | 2/2006 | Iechi |
| 7,276,728 | B2 | 10/2007 | Iechi et al. |
| 2001/0029098 | A1 | 10/2001 | Yamazaki |
| 2002/0022299 | A1 | 2/2002 | Jackson |
| 2002/0155729 | A1 | 10/2002 | Baldwin |
| 2002/0164835 | A1 | 11/2002 | Dimitrakopoulos |
| 2003/0011040 | A1 | 1/2003 | Bosco |
| 2003/0015698 | A1 | 1/2003 | Baldo |
| 2003/0042482 | A1 | 3/2003 | Jun |
| 2003/0170937 | A1 | 9/2003 | Eccleston |
| 2003/0227253 | A1 | 12/2003 | Seo |
| 2004/0004215 | A1 | 1/2004 | Iechi |
| 2004/0012018 | A1 | 1/2004 | Tanabe |
| 2004/0079949 | A1 | 4/2004 | Chiyo |
| 2004/0159836 | A1 | 8/2004 | Sugimoto |
| 2004/0169184 | A1 | 9/2004 | Udagawa |
| 2005/0079646 | A1 | 4/2005 | Onishi |

FOREIGN PATENT DOCUMENTS

| | | |
|---|---|---|
| JP | 2001-189466 A | 7/2001 |
| JP | 2002-299046 A | 10/2002 |
| JP | 2002-299049 A | 10/2002 |
| JP | 2003-258267 A | 9/2003 |
| JP | 2004-006476 A | 1/2004 |
| JP | 2004-128028 | 4/2004 |
| WO | WO 01/95384 | 12/2001 |

\* cited by examiner

ORGANIC SEMICONDUCTOR DEVICE

CROSS-REFERENCE TO RELATED APPLICATIONS

This application is a continuation of U.S. application Ser. No. 11/277,458, filed Mar. 24, 2006, now allowed, which claims the benefit of a foreign priority application filed in Japan as Serial No. 2005-087893 on Mar. 25, 2005, all of which are incorporated by reference.

BACKGROUND OF THE INVENTION

1. Field of the Invention

The present invention relates to an organic semiconductor device with a vertical structure. In particular, the invention relates to a composite-type organic semiconductor device having both functions of an organic thin film transistor and a light-emitting element.

2. Description of the Related Art

An organic thin film transistor is a driving element formed by using an organic semiconductor film as an active layer. Since the use of an organic semiconductor material enables reduction in weight, it is expected to be put into practical applications such as a next-generation portable electronic appliance or a large-screen display.

In addition, in an organic thin film transistor with a vertical structure, current flows in the vertical direction of an active layer; therefore, current flowing in the film thickness direction can be controlled, enabling a shorter channel length. Therefore, a large current density and high operating speed can be achieved even in the case of using an organic semiconductor film with high resistance and yet low mobility.

As an organic thin film transistor with a vertical structure, such a structure is known that a meshed gate electrode is sandwiched between organic semiconductor layers that are sandwiched between a pair of electrodes, and a metal material, a conductive high-polymer material or the like is used for the material of the gate electrode (cf. Japanese Patent Laid-Open No. 2004-128028).

However, there are such problems that in the case of forming a gate electrode with a metal material, optimization of a shape for stabilizing the element characteristics is difficult to achieve, while in the case of forming a gate electrode with an organic conductive film such as a conductive high-polymer material, electrical characteristics cannot be controlled sufficiently.

Further, even in the case of a composite-type organic semiconductor device where an organic semiconductor layer of an organic thin film transistor emits light, there is a problem in that the luminance and quantum efficiency cannot be controlled sufficiently.

SUMMARY OF THE INVENTION

Thus, it is an object of the invention to provide a composite-type organic semiconductor device with a vertical structure that has both functions of an organic thin film transistor and a light-emitting element, where electrical characteristics as both the organic thin film transistor and the light-emitting element can be controlled in the case of forming a gate electrode with an organic conductive film, and a manufacturing method thereof.

In view of the foregoing problems, the invention provides an organic semiconductor device with a vertical structure where organic semiconductor films are sandwiched between a pair of electrodes functioning as a source electrode and a drain electrode of an organic thin film transistor as well as functioning as an anode and a cathode of a light-emitting element; a thin organic conductive film functioning as a gate electrode is sandwiched between the organic semiconductor films; and a part of the organic conductive film is electrically connected to an auxiliary electrode. Note that the organic semiconductor device with a vertical structure corresponds to an organic semiconductor device where electrical characteristics as both an organic thin film transistor and a light-emitting element can be controlled.

Note that in the case where the organic semiconductor device functions as a light-emitting element, a light-emitting material is required to be used for a part of or the entire organic semiconductor film.

Note that one feature of the invention is an organic semiconductor device including at least a first electrode; a first organic semiconductor film formed on the first electrode; a second organic semiconductor film formed on the first organic semiconductor film; an organic conductive film formed on the second organic semiconductor film; a second electrode and a third organic semiconductor film each formed on the organic conductive film; and a third electrode formed on the third organic semiconductor film, where the second electrode is formed so as not to overlap the first electrode and the third electrode; and the third electrode is formed so as to overlap the first electrode.

In the aforementioned structure, the organic conductive film is formed to be not thinner than 10 nm and not thicker than 30 nm. Note that the organic conductive film is formed by using a material with higher conductivity than the organic semiconductor films (including the first organic semiconductor film, the second organic semiconductor film, and the third organic semiconductor film). In addition, since the organic conductive film is formed to cause band bending at the interface between the second organic semiconductor layer and the third organic semiconductor layer, it is required to have a thickness enough to cause the band bending. Note that with a thicker organic conductive film, a voltage applied to the interface becomes low; therefore, a sufficient function as an electrode cannot be obtained.

In addition, the second organic semiconductor film and the third organic semiconductor film can be formed by using organic compounds with a bipolar property, and one or both of the films contain dopant.

As a dopant, the following can be used: 1,1,4,4-tetraphenyl-1,3-butadiene [TPB]; parylene; coumarin 6; rubrene; or 4-dicyanomethylene-2-methyl-6-(p-dimethylamino-styryl)-4H-pyran [DCM1].

In addition, a part of the organic conductive film is formed in recessed portions of the surface of the second organic semiconductor film.

In the organic semiconductor device of the invention, the amount of current flowing between the first electrode and the third electrode can be controlled by a voltage applied from the organic conductive film.

Further, in the organic semiconductor device of the invention, the luminance in the second organic semiconductor layer or the third organic semiconductor layer can be controlled by a voltage applied from the organic conductive film.

Another feature of the invention is a manufacturing method of the aforementioned organic semiconductor device, including the steps of forming a first electrode over a substrate; applying a first solution onto the first electrode to form a first organic semiconductor film; applying a second solution onto the first organic semiconductor film; drying the second solution at a temperature of not lower than 60° C. and not higher than 80° C. in a nitrogen atmosphere to form a second organic semiconductor film; applying a third solution onto the second organic semiconductor film in order to change the surface state of the second organic semiconductor film; applying a fourth solution onto the second organic semiconductor film; drying the fourth solution at a temperature of not lower than 60° C. and not higher than 80° C. in a nitrogen atmosphere to form an organic conductive film; applying a fifth solution onto the organic conductive film; drying the fifth solution at a temperature of not lower than 60° C. and not higher than 80° C. in a nitrogen atmosphere to form a third organic semiconductor film; removing a part of the third organic semiconductor film; forming a second electrode on a part of the exposed organic conductive film so as not to overlap the first electrode; and forming a third electrode on the third organic semiconductor film so as to overlap the first electrode.

Note that the second solution and the fifth solution contain the same organic compound. Preferably, the second solution and the fifth solution contain poly[2-methoxy-5-(2'-ethylhexyloxy)-1,4-phenylenevinylene] [MEH-PPV], and the fourth solution contains poly(3,4-ethylenedioxythiophene) [PEDOT] and polystyrene sulfonate [PSS].

In the manufacture of the organic semiconductor device of the invention, the first solution, the second solution, the third solution, the fourth solution, and the fifth solution are applied by any one of a droplet discharge method, ink-jet deposition, spin coating, and dipping.

By carrying out the invention, a composite-type organic semiconductor device can be manufactured with a vertical structure where only organic materials are sandwiched between a pair of electrodes, which has both functions of an organic thin film transistor and a light-emitting element. Note that the organic semiconductor device of the invention can be sufficiently controlled in its electrical characteristics as both an organic thin film transistor and a light-emitting element.

DETAILED DESCRIPTION OF THE INVENTION

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein.

Embodiment Mode 1

Figure 1:
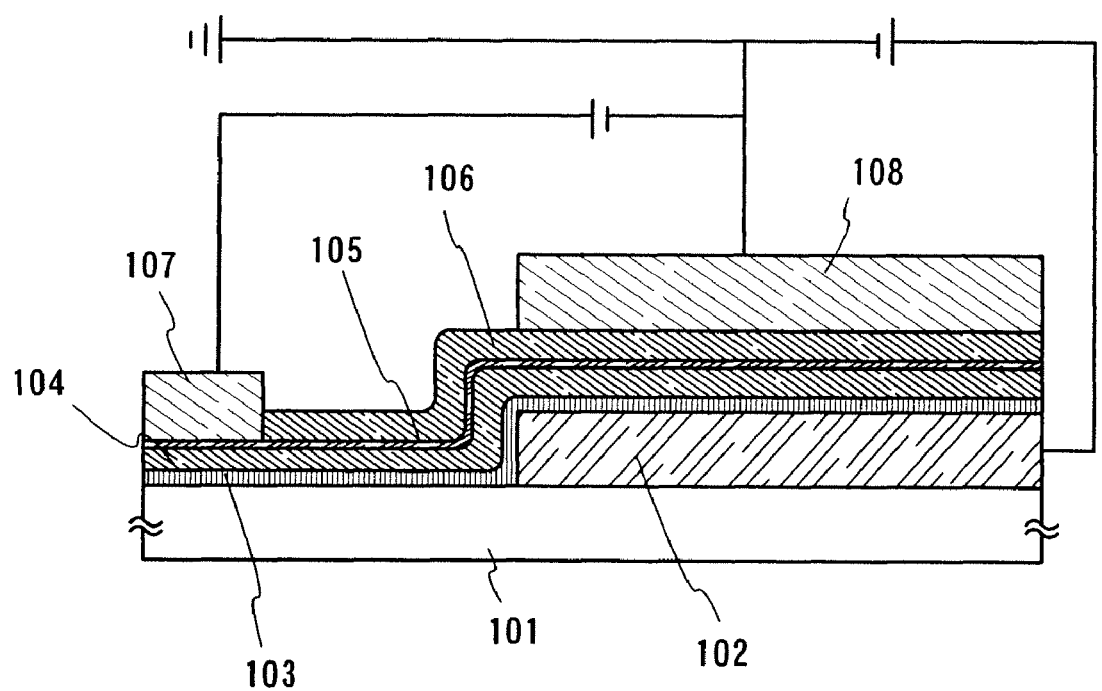
FIG. 1 illustrates an element structure of an organic thin film element with a vertical structure.

In Embodiment Mode 1, description is made with reference to FIG. 1 on a structure of an organic thin film element with a vertical structure as one mode of the organic semiconductor device of the invention.

Note that the organic thin film element with a vertical structure described herein has a function of not only an organic thin film transistor but also a light-emitting element. That is, light-emitting organic semiconductor films are provided between a source electrode and a drain electrode of an organic thin film transistor, and an organic conductive film provided between the organic semiconductor films functions as a gate electrode of the organic thin film transistor.

As shown in FIG. 1, a first electrode 102 is formed over a substrate 101. Note that the first electrode 102 is formed over a part of the substrate 101, and in Embodiment Mode 1, the first electrode 102 functions as a drain electrode of an organic thin film element with a vertical structure as well as functioning an anode of a light-emitting element.

The substrate 101 may be formed by using glass, quartz, light-transmissive plastic or the like. The first electrode 102 can be formed by using a conductive material. However, when functioning as an anode of a light-emitting element, the first electrode 102 is preferably formed by using, for example, a metal or alloy with a high work function (4.0 eV or higher), or a stacked film of such metal or alloy with a conductive material. Note that as a specific example of the anode material, ITO (Indium Tin Oxide) or the like can be used.

Over the first electrode 102 and the substrate 101, a first organic semiconductor film 103 is formed, which has a function to improve an injection property of holes from the first electrode 102. Specifically, the first organic semiconductor film 103 is formed by using a compound of poly(3,4-ethylenedioxythiophene) [PEDOT] or polyaniline [PANI] with camphor sulfonic acid [CSA] or polystyrene sulfonate [PSS] as an acceptor material. Note that the first organic semiconductor film 103 is preferably not thinner than 10 nm and not thicker than 30 nm.

On the first organic semiconductor film 103, a second organic semiconductor film 104 is formed. The second organic semiconductor film 104 functions as a channel region of the organic thin film element with a vertical structure. Note that the second organic semiconductor film 104 is formed by using a material with a bipolar property or a material with a hole transporting property that has a function to transport holes.

In the case where the material corresponds to a light-transmissive material (e.g., polyparaphenylene vinylene derivatives; polyfluorene derivatives; polythiophene derivatives or the like), or a material containing dopant (e.g., 1,1,4,4,-Tetraphenyl-1,3-butadiene [TPD]; perylene; coumarin 6; rubrene; DCM1 or the like), the second organic semiconductor film 104 also functions as a light-emitting region of the organic thin film element with a vertical structure.

As a material for forming the second organic semiconductor film 104, polyparaphenylene vinylene derivatives, polyfluorene derivatives, polythiophene derivatives or the like can be used. Note that the second organic semiconductor film 104 is preferably not thinner than 50 nm and not thicker than 80 nm.

On the second organic semiconductor film 104, an organic conductive film 105 is formed. The organic conductive film 105 functions as a gate electrode of the organic thin film element with a vertical structure. Note that that the organic conductive film 105 has a thickness of not less than 1 nm and not more than 30 nm, which is thinner than the other films, and which has a partially-continuous or discontinuous meshed shape due to the irregularity on its surface.

On the organic conductive film 105, a third organic semiconductor film 106 is formed. The third organic semiconductor film 106 functions as a channel region of the organic thin film element with a vertical structure as shown in FIG. 1. Note that the third organic semiconductor film 106 is formed by using a material with a bipolar property or a material with an electron transporting property that has a function to transport electrons. In the case where the material corresponds to a light-transmissive material or a material containing dopant, the third organic semiconductor film 106 also functions as a light-emitting region of the organic thin film element with a vertical structure.

Note that the material and dopant used for forming the third organic semiconductor film 106 may be the same material as that of the second organic semiconductor film 104. The third organic semiconductor film 106 is preferably not thinner than 50 nm and not thicker than 80 nm.

In a portion where the third organic semiconductor film 106 is not formed on the organic conductive film 105, a second electrode 107 is formed. Note that the second electrode 107 is formed so as not to overlap the first electrode 102, and functions as an auxiliary electrode of the organic conductive film 105.

As a material for forming the second electrode 107, a conductive material (e.g., Al, PEDOT/PSS or the like) can be used. Note that the second electrode 107 is preferably not thinner than 50 nm and not thicker than 100 nm.

On the third organic semiconductor film 106, a third electrode 108 is formed so as to overlap the first electrode 102. In Embodiment Mode 1, the third electrode 108 functions as a source electrode of the organic thin film element with a vertical structure as well as functioning as a cathode of a light-emitting element. Therefore, the third electrode 108 is preferably formed by using, for example, a metal or alloy with a low work function (3.8 eV or lower), or a stacked film of such metal or alloy with a conductive material.

As a specific example of the metal or alloy with a low work function, there is an element of Group 1 or 2 of the periodic table, namely alkaline metals such as Li or Cs, alkaline earth metals such as Mg, Ca or Sr, alloys containing these (MgAg or AlLi) or the like.

In an organic thin film element with a vertical structure of the invention, the amount of current flowing between the first electrode 102 and the third electrode 108 can be controlled by a voltage applied from the second electrode 107 and the organic conductive film 105. Further, in the case of using a light-transmissive material for one or both of the second organic semiconductor film 104 and the third organic semiconductor film 106, the luminance of the organic semiconductor films containing the light-transmissive material can be controlled by a voltage applied from the second electrode 107 and the organic conductive film 105.

Embodiment Mode 2

In Embodiment Mode 2, description is made with reference to FIGS. 2A to 2D and 3A to 3D on a manufacturing method of an organic thin film element with a vertical structure as one mode of the organic semiconductor device of the invention.

Figure 2A:
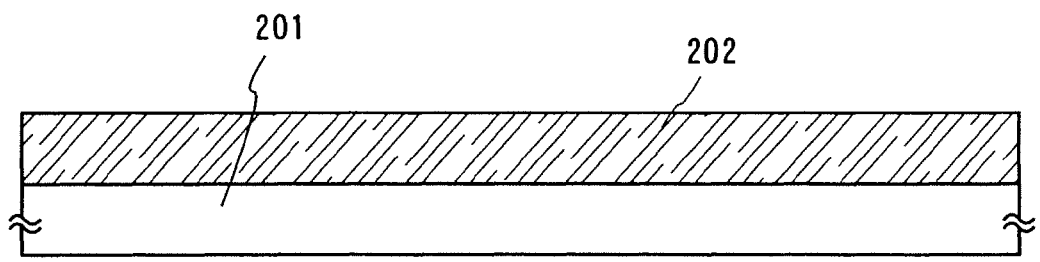
FIGS. 2A to 2D illustrate a manufacturing method of an organic thin film element with a vertical structure.

First, a first conductive layer 202 is formed over a substrate 201. Note that the first conductive film 202 can be formed by vacuum vapor deposition, sputtering or the like. The first conductive film 202 is preferably not thinner than 100 nm and not thicker than 200 nm (FIG. 2A).

Note that in Embodiment Mode 2, the first conductive layer 202 functions as a drain electrode of an organic thin film transistor as well as functioning as an anode of a light-emitting element; therefore, it is preferably formed by using, for example, a conductive material, a metal or alloy with a high work function (4.0 eV or higher), a stacked film of such metal or alloy with a conductive material (e.g., ITO (Indium Tin Oxide)), or the like.

Next, the first conductive layer 202 is partially removed by etching to form a first electrode 203. Etching here may be performed by using a material capable of etching the material used for the first conductive layer 202 (e.g., aqua regia or the like).

Figure 2B:
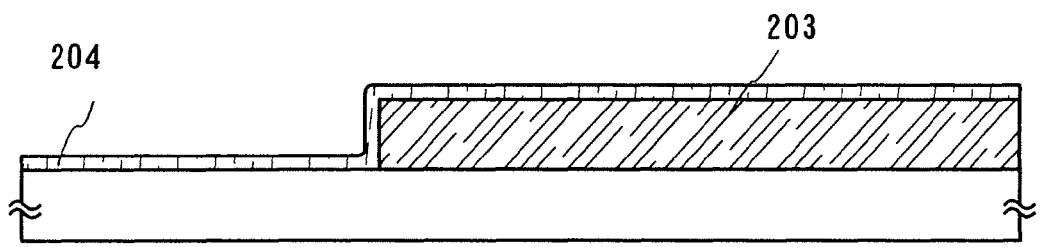

Next, a first organic semiconductor film 204 is formed over the substrate 201 and the first electrode 203 (FIG. 2B). Here, the first organic semiconductor film 204 is preferably formed to be not thinner than 10 nm and not thicker than 30 nm. Note that the first organic semiconductor film 204 can be formed by coating, for example by spin coating, ink-jet deposition, a droplet discharge method, dipping or the like. Note that in Embodiment Mode 2, the first organic semiconductor film 204 is formed by using a solution containing a material with a hole injection property. As a material with a hole injection property, for example, PEDOT or the like can be used. After applying a solution containing a material with a hole injection property, the solution is required to be dried at a temperature of not lower than 180° C. and not higher than 200° C. for 4 to 10 minutes.

Figure 2C:
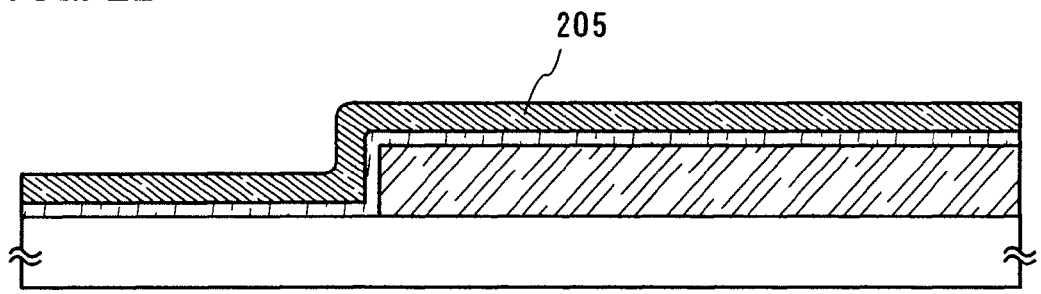

Next, a second organic semiconductor film 205 is formed on the first organic semiconductor film 204 (FIG. 2C). Here, the second organic semiconductor film 205 is preferably formed to be not thinner than 50 nm and not thicker than 80 nm. Note that the second organic semiconductor film 205 is formed by coating similarly to the first organic semiconductor film 204. In Embodiment Mode 2, the second organic semiconductor film 205 is formed by applying a solution containing a material with a bipolar property or a hole transporting property.

As a material having a bipolar property or a hole transporting property, there are, for example, derivatives of poly(paraphenylene vinylene) such as poly(2,5-dialkoxy-1,4-phenylenevinylene) [RO-PPV]; poly[2-methoxy-5-(2'-ethylhexyloxy)-1,4-phenylenevinylene] [MEH-PPV]; poly (2-dialkoxyphenyl-1,4-phenylenevinylene) [ROPh-PPV]; poly[2-methoxy-5-(2'-ethylhexyloxy)-1,4-(1-cyanovinylene)phenylenevinylene] [CN-PPV]; and poly(2,5-dihexyloxy-1,4-phenylenevinylene); derivatives of polyparaphenylene such as poly(2,5-dialkoxy-1,4-phenylene) [RO-PPP]; poly[2-methoxy-5-(2'-ethylhexyloxy)-1,4-(1-cyanovinylene)phenylene] [CN-PPP]; and poly(2,5-dihexyloxy-1,4-phenylenevinylene); derivatives of polythiophene such as poly (3-alkylthiophene) [PAT]; poly(3-hexylthiophene) [PHT]; poly(thienylenevinylene) [PTV]; poly(3-cyclohexythiophene [PCHT]; poly(3-cyclohexyl-4-methylthiophene) [PCHMT]; poly(3,4-dicyclohexylthiophene [PDCHT]; poly [3-(4-octylphenyl)-thiophene] [POPT]; poly(3-(4-octylphenyl)-2,2-bithiophene) [PTOPT]; poly(3-(2,5-octylbiphenyl)-thiophene) [PDOPT]; derivatives of polyfluorene such as poly(9,9-dialkylfluorene) [PDAF]; poly(9,9-dioctylfluorene) [PDOF]; poly[9,9-di(ethylhexyl)fluorene] [PF2/6]; poly(9,9-dioctylfluorene-bithiophene) [F8T2], or the like.

After applying a solution containing a material with a bipolar property or a hole injection property, the solution is required to be dried at a temperature of not lower than 60° C. and not higher than 80° C. for 2.5 to 3 hours.

Figure 2D:
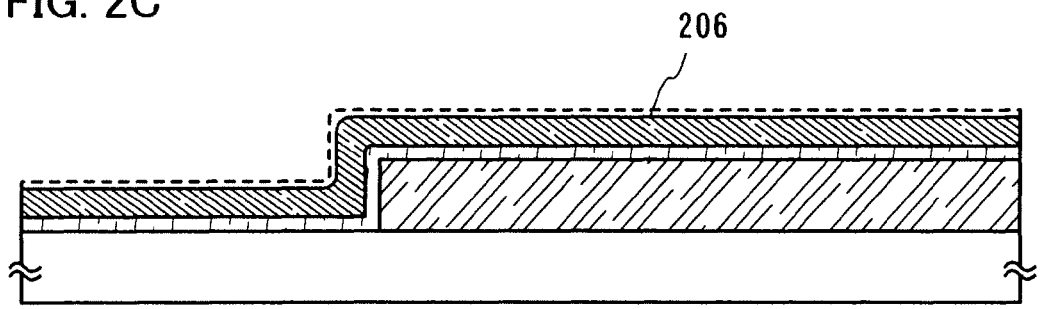

Next, a first solution 206 is applied onto the second organic semiconductor film 205 (FIG. 2D). By applying the first solution 206, the surface state of the second organic semiconductor film 205 can be changed. Accordingly, hexane or heptane is used as the first solution 206.

Figure 3A:
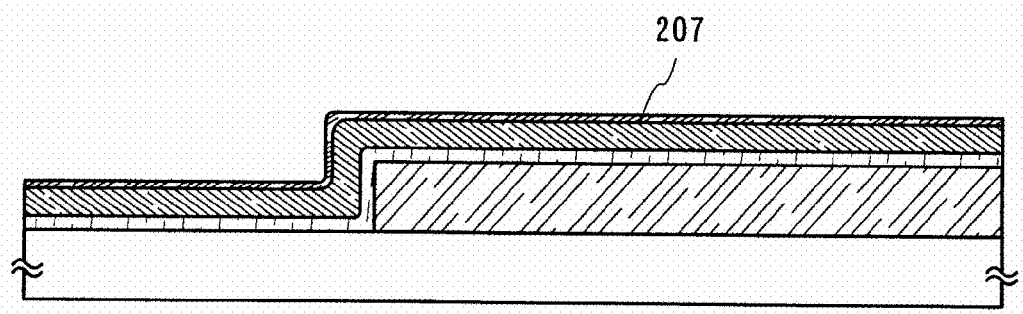
FIGS. 3A to 3D illustrate a manufacturing method of an organic thin film element with a vertical structure.

Then, an organic conductive film 207 is formed on the second organic semiconductor film 205 (FIG. 3A). Here, the organic conductive film 207 is preferably formed to be not thinner than 1 nm and not thicker than 30 nm, or more preferably not thinner than 10 nm and not thicker than 30 nm. Note that the organic conductive film 207 is formed by coating similarly to the first organic semiconductor film 204. In Embodiment Mode 2, the organic conductive film 207 is formed by coating a solution containing a conductive high-polymer material. As a conductive high-polymer material, for example, PEDOT/PSS or the like can be used.

Note that after applying a solution containing a conductive high-polymer material, the solution may be dried at a temperature of not less than 60° C. and not higher than 80° C. for 1 hour.

Figure 3B:
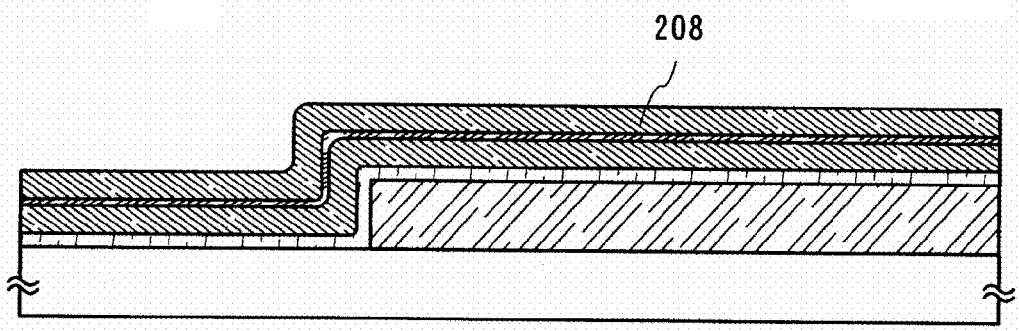

Next, a third organic semiconductor film 208 is formed on the organic conductive film 207 (FIG. 3B). Here, the third organic semiconductor film 208 is preferably formed to be not thinner than 50 nm and not thicker than 80 nm. Note that the third organic semiconductor film 208 is formed by coating similarly to the first organic semiconductor film 204. In Embodiment Mode 2, the third organic semiconductor film 208 is formed by applying a solution containing a material having a bipolar property or an electron transporting property. As a material having a bipolar property or an electron transporting property, a similar material to the aforementioned material for forming the second organic semiconductor film can be used.

After applying a solution containing a material with a bipolar property or an electron transporting property, the solution may be dried at a temperature of not less than 60° C. and not higher than 80° C. for 1 hour.

Figure 3C:
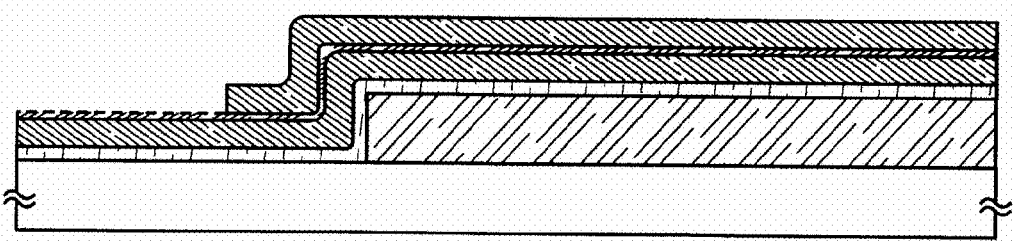
Figure 3D:
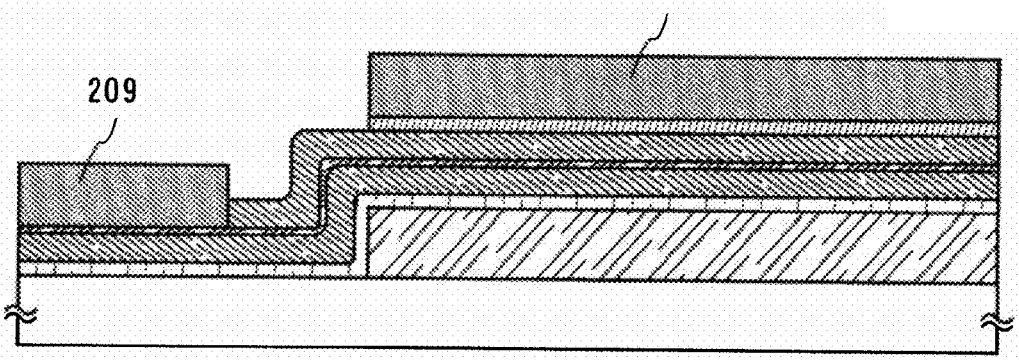

Next, the third organic semiconductor film 208 is partially removed by etching (FIG. 3C). Note that removed here is a portion of the third organic semiconductor film 208 that does not overlap the first electrode 203. Etching may be performed by using a material capable of etching the material used for the third organic semiconductor film 208 (e.g., toluene or the like).

Next, a second electrode 209 is formed using a mask on the organic conductive film 207 that has been exposed by etching. The second electrode 209 is electrically connected to the organic conductive film 207 and functions as an auxiliary electrode. Here, the second electrode 209 is preferably formed to be not thinner than 50 nm and not thicker than 100 nm.

Note that the second electrode 209 can be formed by vacuum vapor deposition, sputtering or the like.

Further, a third electrode 210 is formed on the third organic semiconductor film 208 so as to overlap the first electrode 203. Here, the third electrode 210 is preferably formed to be not thinner than 50 nm and not thicker than 200 nm. Note that the third electrode 210 can be formed by vacuum vapor deposition, sputtering or the like similarly to the second electrode 209.

In Embodiment Mode 2, the third electrode 210 functions as a source electrode of an organic thin film transistor as well as functioning as a cathode of a light-emitting element; therefore, the third electrode 210 is preferably formed by using, for example, a conductive material (e.g., Al, Ti, Ta or the like), a metal (e.g., Ca, Sr, Ba or the like) or alloy with a low work function (3.5 eV or lower), or a stacked film of such metal or alloy with a conductive material. In addition, the second electrode 209 may be formed by using a conductive material such as Al, Ti or Ta.

Through the aforementioned steps, an organic thin film element with a vertical structure can be formed.

Embodiment 1

In this embodiment mode, description is made on an organic thin film element with a vertical structure that is manufactured in accordance with the manufacturing method described in Embodiment Mode 2.

In this embodiment, a film composed of ITO (Indium Tin Oxide) is deposited as a conductive film over a glass substrate by vacuum vapor deposition with a thickness of 110 nm, and then the surface of the conductive film is rinsed by ultrasonic cleaning with acetone and subsequently by boiling with 2-propanol. Then, the conductive film is partially etched with aqua regia. Accordingly, the first electrode is formed. After the etching, the first electrode is rinsed again by ultrasonic cleaning with acetone and subsequently by boiling with 2-propanol, which is followed by UV ozone cleaning.

Note that in this embodiment, depending on the application of the organic thin film element, the first electrode functions as a drain electrode of an organic thin film transistor as well as functioning as an anode of a light-emitting element.

Then, a mixed solution of poly(3,4-ethylenedioxythiophene [PEDOT] and polystyrene sulfonate [PSS] with 2-propanol (PEDOT/PSS: 2-propanol=1:3) are applied onto the glass substrate and the first electrode by spin coating, and then dried at 200° C. for 10 minutes. Accordingly, a first organic semiconductor film with a hole injection property is formed. Note that in this embodiment, the first organic semiconductor film is formed with a thickness of 30 nm.

Then, a MEH-PPV solution obtained by dissolving 1 wt % of poly[2-methoxy-5-(2'-ethylhexyloxy)-1,4-phenylenevinylene] [MEH-PPV] into toluene is applied by spin coating, and then it is dried at a temperature of not lower than 60° C. and not higher than 70° C. in a nitrogen atmosphere for 2.5 hours. Accordingly, a second organic semiconductor film having a bipolar property is formed. Note that in this embodiment, the second organic semiconductor film is formed to be not thinner than 50 nm and not thicker than 80 nm.

Figure 4A:
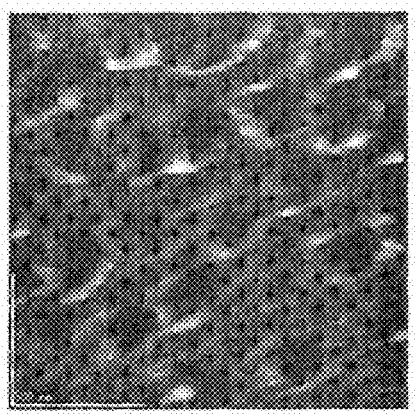
FIGS. 4A to 4F are AEM photographs of an organic thin film in accordance with Embodiment 1.
Figure 4B:
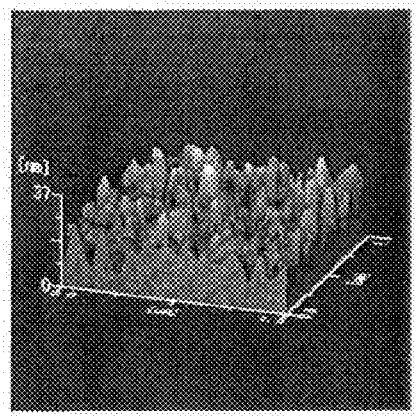

FIGS. 4A and 4B show photographs of a surface of the second organic semiconductor film observed with an atomic force microscopy (AFM). The average roughness (RMS: Root Mean Square) of the surface of the second organic semiconductor film was 3.60 nm. Accordingly, it can be seen that there are many irregularities on the surface of the second organic semiconductor film.

Figure 4C:
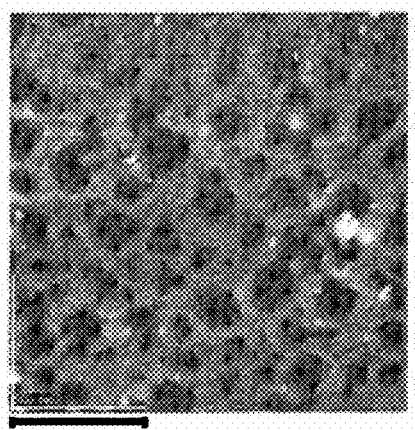
Figure 4D:
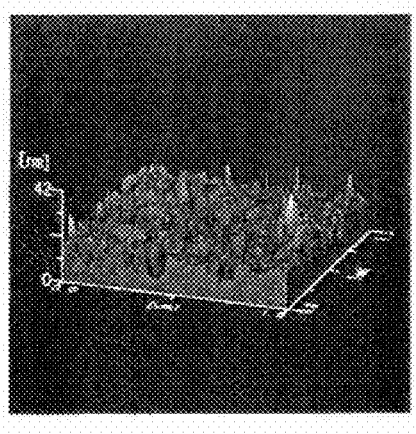

Next, the second organic semiconductor film is coated with hexane by spin coating. FIGS. 4C and 4D show photographs of a surface observed with an AFM after applying hexane onto the second organic semiconductor film. The average roughness (RMS) of the surface of the second organic semiconductor film was 2.90 nm. Accordingly, it can be confirmed that the surface state of the second organic semiconductor film was changed by applying hexane.

Further, the surface of the second organic semiconductor film is coated with a mixed solution of PEDOT and PSS together with a mixed solution of hexane and 2-propanol. Note that the mixed solutions used herein, that are the mixed solution of hexane and 2-propanol (mixture ratio of hexane: 2-propanol=1:10) and the mixed solution of PEDOT and PSS are mixed at a ratio of 3:1 to be applied together onto the surface of the second organic semiconductor film.

Figure 4E:
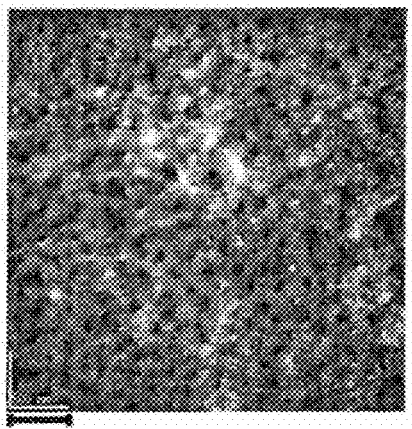
Figure 4F:
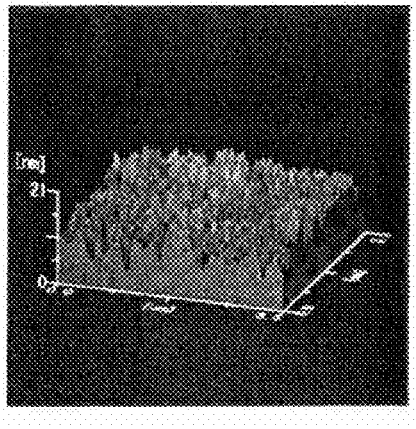

After application, the solution is dried at 70° C. for 1 hour in a nitrogen atmosphere. Accordingly, an organic conductive film functioning as a gate electrode of the organic thin film element can be formed. Note that in this embodiment, the thickness of the organic conductive film is set to 20 nm. FIGS. 4E and 4F show photographs of the surface. From the photographs of the surface, it can be seen that an organic conductive film is formed in a manner filling into the recessed portions of the second organic semiconductor film that has been formed previously. Note that the organic thin film is quite thin as compared to the other films, and is formed to have a partially discontinuous state (meshed shape) because it is formed on the surface of a film having recessions. Note that the average roughness (RMS) of the surface of the organic conductive film was 1.45 nm.

Next, the organic conductive film is coated with a MEH-PPV solution that is the same solution used for manufacturing the second organic semiconductor film, and then it is dried at a temperature of not lower than 60° C. and not high than 80° C. for 1 hour in a nitrogen atmosphere. Accordingly, a third organic semiconductor film with a bipolar property can be formed. Note that in this embodiment, the third organic semiconductor film is formed to be not thinner than 50 nm and not thicker than 80 nm.

Then, a part of the third organic semiconductor film (which corresponds to a portion that does not overlap the first electrode) is removed by etching to partially expose the organic conductive film. Note that in this embodiment, the organic conductive film is partially etched by using toluene.

On the exposed organic conductive film, a second electrode is formed by vacuum vapor deposition using a mask. Note that in this embodiment, the second electrode is formed with a thickness of 100 nm by using Al. Accordingly, the second electrode functioning as an auxiliary electrode can be formed, which is electrically connected to the previously formed organic conductive film.

Then, a third electrode is formed on the third organic semiconductor film so as to overlap the first electrode by vacuum vapor deposition using a mask. Note that the third electrode in this embodiment is formed by stacking Ca (30 nm) and Al (70 nm). In this embodiment, the third electrode functions as a source electrode in the case where the organic thin film element is regarded as an organic thin film transistor as well as functioning as a cathode in the case where the organic thin film element is regarded as a light-emitting element.

Embodiment 2

This embodiment shows the measurement results of the electrical characteristics of an organic thin film element with a vertical structure that has the element structure shown in Embodiment 1. Although the element structure and the manufacturing method are similar to those in Embodiment 1, the film thickness is set to be different in accordance with the measurement conditions.

Figure 5A:
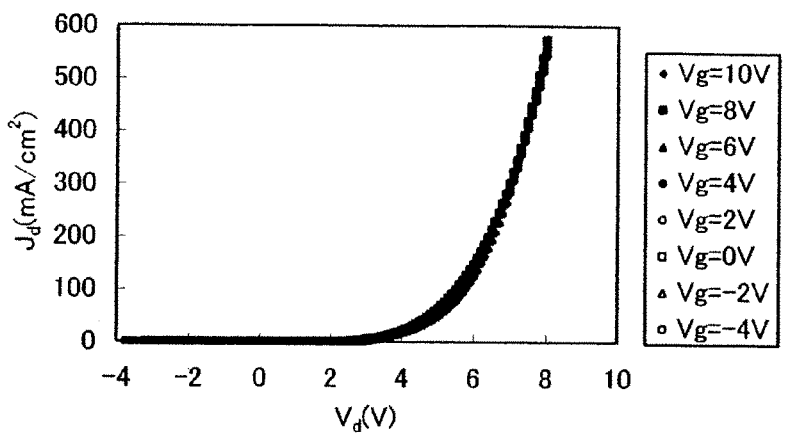
FIGS. 5A to 5C show data on the electrical characteristics of an organic thin film element with a vertical structure.

FIG. 5A shows a measurement result of voltage-current density characteristics of an organic thin film element that has a similar structure to that in Embodiment 1, where the first electrode is of 110 nm thick, the first organic semiconductor film is of 30 nm thick, the second organic semiconductor film is of 45 nm thick, the organic conductive film is of 50 nm thick, the third organic semiconductor film is of 50 nm thick, the second electrode is of 100 thick, the third electrode is of 100 nm thick (Al: 70 nm/Ca: 30 nm). Note that in FIG. 5A, the horizontal axis shows a voltage ($V_d$) between the first electrode and the third electrode (between the source electrode and the drain electrode) and the vertical axis shows a current density ($J_d$) between the first electrode and the third electrode (between the source electrode and the drain electrode). In this case, there is no change in the electrical characteristics in accordance with voltages applied from the organic conductive film.

Figure 5B:
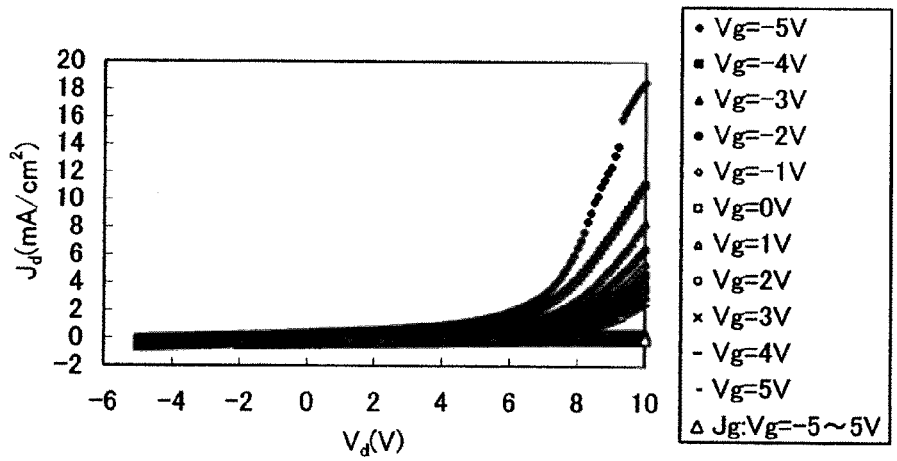

On the other hand, as for an organic thin film element in the case where only the organic conductive film of the organic thin film element in FIG. 5A is formed to have a thickness of 20 nm as shown in FIG. 5B, it is possible to see changes in the electrical characteristics in accordance with voltages applied from the organic conductive film. Note that the horizontal axis and vertical axis in FIG. 5B show the same items as those in FIG. 5A. In addition, FIG. 5B also shows a current density ($J_g$) between the third electrode and the second electrode and the organic conductive film (between the source electrode and the gate electrode). This data clarifies that the amount of current flowing between the third electrode and the second electrode and the organic conductive film is slight, and has no effect on the current flowing between the first electrode and the third electrode (between the source electrode and the drain electrode). Accordingly, it can be seen that only an electrical field is applied to the second electrode and the organic conductive film (gate electrode).

Note that since the organic conductive film is formed to cause band bending at the interface between the second organic semiconductor layer and the third organic semiconductor layer, it is preferably formed to be not thinner than 1 nm and not thicker than 30 nm, or more preferably not thinner than 10 nm and not thicker than 30 nm. Note that the reason why the electrical characteristics could not be changed is that a voltage applied to the interface becomes low if a voltage is applied to an organic conductive film that is increased in thickness, thus a band bending effect is decreased and a sufficient function as an electrode cannot be obtained.

Figure 5C:
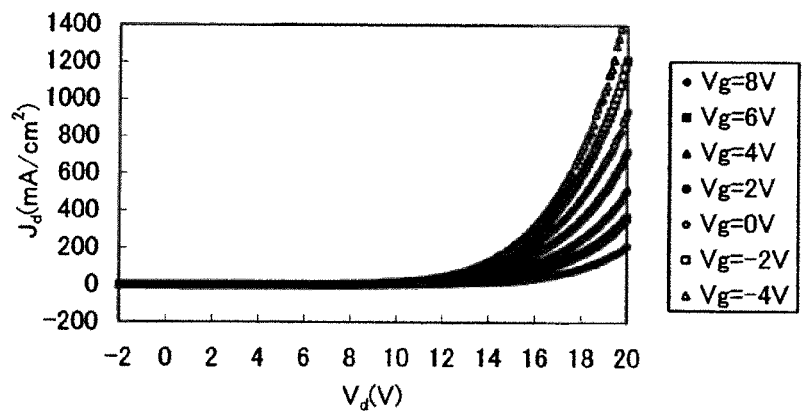

Further, in the case where the second organic semiconductor film and the third organic semiconductor film are formed thick as shown in FIG. 5C in such a manner that the second organic semiconductor film is of 60 nm thick, the organic conductive film is of 20 nm thick, and the third organic semiconductor film is of 65 thick, it can be confirmed that the electrical characteristics can be changed more stably than in FIG. 5B. In the case where the second organic semiconductor film and the third organic semiconductor film are thicker than 45 nm, it can be confirmed that the electrical characteristics are changed along with a rectifying function. Note that the second organic semiconductor film and the third organic semiconductor film preferably have about the same thickness.

If the second organic semiconductor film and the third organic semiconductor film are thicker than 80 nm, it is impossible to see changes in the electrical characteristics. Also, if the organic conductive film is thicker than 40 nm, it is impossible to see changes in the electrical characteristics.

Figure 6A:
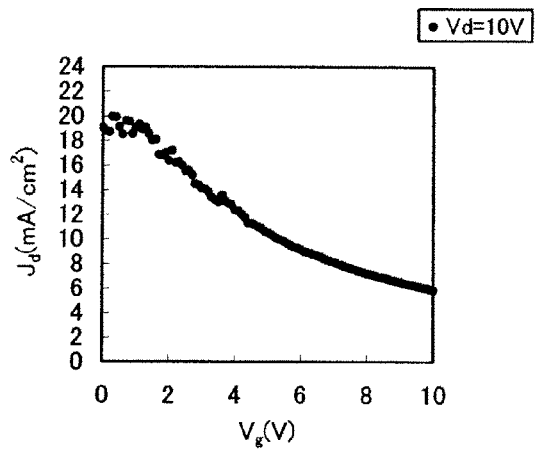
FIGS. 6A to 6C show data on the electrical characteristics of an organic thin film element with a vertical structure.

FIG. 6A shows a measurement result of a relationship between a gate voltage and a current density between a source electrode and a drain electrode of an organic thin film element that has a similar structure to that in Embodiment 1, where the first electrode is of 110 nm thick, the first organic semiconductor film is of 30 nm thick, the second organic semiconductor film is of 65 nm thick, the organic conductive film is of 20 nm thick, the third organic semiconductor film is of 60 nm thick, the second electrode is of 100 nm thick, the third electrode is of 100 nm thick (Al: 70 nm/Ca: 30 nm). Note that in FIG. 6A, the horizontal axis shows a voltage ($V_g$ applied from the second electrode and the organic conductive film, and the vertical axis shows a current density ($J_d$) between the first electrode and the third electrode (between the source electrode and the drain electrode). It can be confirmed that the amount of drain current can be controlled by changing the gate voltage. Note that the mutual conductance: $g_m=dI_d/dV_g$ is $1.7\times10^{-5}$ S.

Figure 6B:
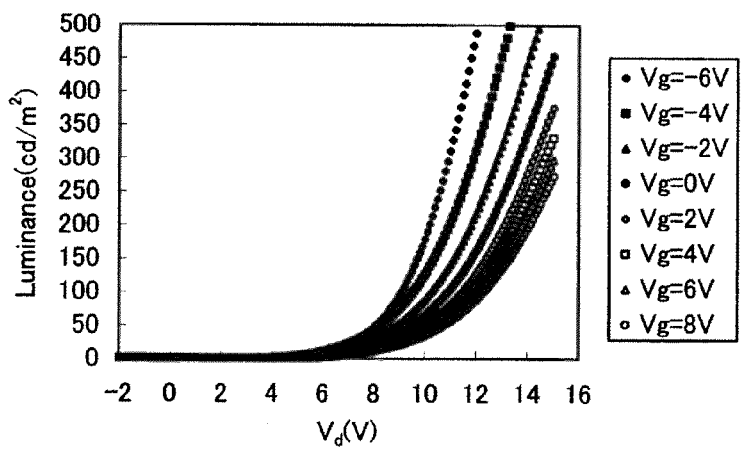

FIG. 6B also shows a measurement result of the luminance in a similar organic thin film element where the luminance of light from the third organic semiconductor film with respect to the drain voltage is measured by changing the gate voltage. Note that in FIG. 6B, the horizontal axis shows a voltage ($V_d$) between the first electrode and the third electrode (the source electrode and the drain electrode), and the vertical axis shows the luminance (cd/m$^2$) of light obtained from the third organic semiconductor film. It can be confirmed that the luminance can be controlled by changing the gate voltage as in FIG. 6A.

Figure 6C:
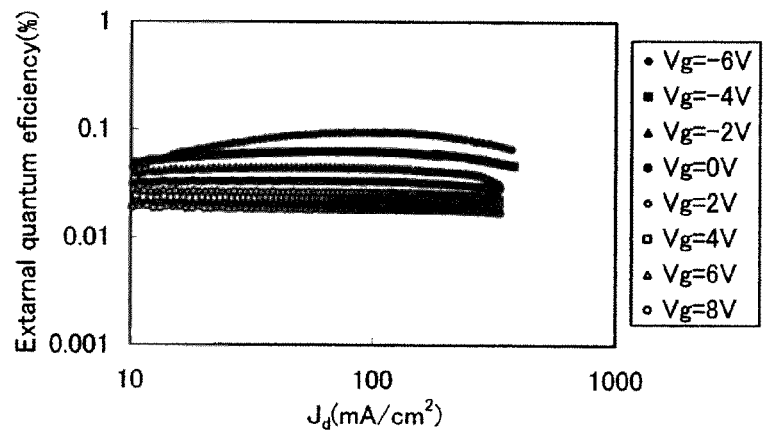

FIG. 6C shows a measurement result of the external quantum efficiency in a similar organic thin film element where the external quantum efficiency of the organic thin film element with respect to the current density ($J_d$) between the source electrode and drain electrode is measured by changing the gate voltage. Note that in FIG. 6C, the horizontal axis shows a current density ($J_d$) between the first electrode and the third electrode (the source electrode and the drain electrode), and the vertical axis shows the external quantum efficiency (%). From the result, it can be confirmed that the external quantum efficiency can be controlled by changing the gate electrode.

From the result described above, the organic thin film element with a vertical structure using an organic conductive film as a gate electrode can be determined to be a composite-type organic thin film element that functions as both an organic thin film transistor and a light-emitting element, since the amount of current flowing between the source electrode and drain electrode can be controlled in the case of an organic thin film transistor while the luminance and the external quantum efficiency can be controlled in the case of a light-emitting element, by changing the gate voltage.

The present application is based on Japanese Priority application No. 2005-087893 filed on Mar. 25, 2005 with the Japanese Patent Office, the entire contents of which are hereby incorporated by reference.

What is claimed is:

1. A manufacturing method of an organic semiconductor device, comprising the steps of:
    forming a first electrode over a substrate;
    applying a first solution on the first electrode for forming a first organic semiconductor film;
    applying a second solution onto the first organic semiconductor film for forming a second organic semiconductor film;
    applying a third solution onto the second organic semiconductor film for changing a surface state of the second organic semiconductor film;
    applying a fourth solution onto the second organic semiconductor film for forming an organic conductive film, after applying the third solution;
    applying a fifth solution onto the organic conductive film for forming a third organic semiconductor film;
    removing a part of the third organic semiconductor film;
    forming a second electrode on a part of the exposed organic conductive film, wherein the second electrode does not overlap the first electrode; and
    forming a third electrode on the third organic semiconductor film, wherein the third electrode at least partly overlaps the first electrode.

2. The manufacturing method of an organic semiconductor device according to claim 1, wherein the organic conductive film is not thinner than 1 nm and not thicker than 30 nm.

3. The manufacturing method of an organic semiconductor device according to claim 1, wherein an organic compound contained in the second solution is identical to an organic compound contained in the fifth solution.

4. The manufacturing method of an organic semiconductor device according to claim 1, wherein hexane or heptane is used as the third solution.

5. The manufacturing method of an organic semiconductor device according to claim 1, wherein the second solution and the fifth solution contain poly[2-methoxy-5-(2'-ethylhexyloxy)-1,4-phenylenevinylene], and the fourth solution contains poly (3,4-ethylenedioxythiophene) and polystyrene sulfonate).

6. The manufacturing method of an organic semiconductor device according to claim 1, wherein the first solution, the second solution, the third solution, the fourth solution, and the fifth solution are applied by any one of a droplet discharge method, ink-jet deposition, spin coating, and dipping.

7. A manufacturing method of an organic semiconductor device, comprising the steps of:
    forming a first electrode over a substrate;
    applying a first solution on the first electrode for forming a first organic semiconductor film, the first organic semiconductor film having a function to improve an injection property of holes from the first electrode;
    applying a second solution onto the first organic semiconductor film for forming a second organic semiconductor film, the second organic semiconductor film having a bipolar property or a hole transporting property;
    applying a third solution onto the second organic semiconductor film for changing a surface state of the second organic semiconductor film;
    applying a fourth solution onto the second organic semiconductor film for forming an organic conductive film, after applying the third solution, the organic conductive film having a partially continuous or discontinuous meshed shape;
    applying a fifth solution onto the organic conductive film for forming a third organic semiconductor film, the third organic semiconductor film having a bipolar property or an electron transporting property;
    removing a part of the third organic semiconductor film;
    forming a second electrode on a part of the exposed organic conductive film, wherein the second electrode does not overlap the first electrode; and
    forming a third electrode on the third organic semiconductor film, wherein the third electrode at least partly overlaps the first electrode.

8. The manufacturing method of an organic semiconductor device according to claim 7, wherein the organic conductive film is not thinner than 1 nm and not thicker than 30 nm.

9. The manufacturing method of an organic semiconductor device according to claim 7, wherein an organic compound contained in the second solution is identical to an organic compound contained in the fifth solution.

10. The manufacturing method of an organic semiconductor device according to claim 7, wherein hexane or heptane is used as the third solution.

11. The manufacturing method of an organic semiconductor device according to claim 7, wherein the second solution and the fifth solution contain poly[2-methoxy-5-(2'-ethylhexyloxy)-1,4-phenylenevinylene], and the fourth solution contains poly (3,4-ethylenedioxythiophene) and polystyrene sulfonate).

12. The manufacturing method of an organic semiconductor device according to claim 7, wherein the first solution, the second solution, the third solution, the fourth solution, and the fifth solution are applied by any one of a droplet discharge method, ink-jet deposition, spin coating, and dipping.

13. A manufacturing method of an organic semiconductor device, comprising the steps of:
- forming a first electrode over a substrate;
- applying a first solution on the first electrode for forming a first organic semiconductor film;
- applying a second solution onto the first organic semiconductor film;
- drying the second solution at a temperature of not lower than 60° C. and not higher than 80° C. in a nitrogen atmosphere for forming a second organic semiconductor film;
- applying a third solution onto the second organic semiconductor film for changing a surface state of the second organic semiconductor film;
- applying a fourth solution onto the second organic semiconductor film, after applying the third solution;
- drying the fourth solution at a temperature of not lower than 60° C. and not higher than 80° C. in a nitrogen atmosphere for forming an organic conductive film;
- applying a fifth solution onto the organic conductive film;
- drying the fifth solution at a temperature of not lower than 60° C. and not higher than 80° C. in a nitrogen atmosphere for forming a third organic semiconductor film;
- removing a part of the third organic semiconductor film;
- forming a second electrode on a part of the exposed organic conductive film, wherein the second electrode does not overlap the first electrode; and
- forming a third electrode on the third organic semiconductor film, wherein the third electrode at least partly overlaps the first electrode.

14. The manufacturing method of an organic semiconductor device according to claim 13, wherein the organic conductive film is not thinner than 1 nm and not thicker than 30 nm.

15. The manufacturing method of an organic semiconductor device according to claim 13, wherein an organic compound contained in the second solution is identical to an organic compound contained in the fifth solution.

16. The manufacturing method of an organic semiconductor device according to claim 13, wherein hexane or heptane is used as the third solution.

17. The manufacturing method of an organic semiconductor device according to claim 13, wherein the second solution and the fifth solution contain poly[2-methoxy-5-(2'-ethylhexyloxy)-1,4-phenylenevinylene], and the fourth solution contains poly (3,4-ethylenedioxythiophene) and polystyrene sulfonate).

18. The manufacturing method of an organic semiconductor device according to claim 13, wherein the first solution, the second solution, the third solution, the fourth solution, and the fifth solution are applied by any one of a droplet discharge method, ink jet deposition, spin coating, and dipping.

19. A manufacturing method of an organic semiconductor device, comprising the steps of:
- forming a first electrode over a substrate;
- applying a first solution on the first electrode for forming a first organic semiconductor film, the first organic semiconductor film having a function to improve an injection property of holes from the first electrode;
- applying a second solution onto the first organic semiconductor film;
- drying the second solution at a temperature of not lower than 60° C. and not higher than 80° C. in a nitrogen atmosphere for forming a second organic semiconductor film, the second organic semiconductor film having a bipolar property or a hole transporting property;
- applying a third solution onto the second organic semiconductor film for changing a surface state of the second organic semiconductor film;
- applying a fourth solution onto the second organic semiconductor film, after applying the third solution;
- drying the fourth solution at a temperature of not lower than 60° C. and not higher than 80° C. in a nitrogen atmosphere for forming an organic conductive film, the organic conductive film having a partially continuous or discontinuous meshed shape;
- applying a fifth solution onto the organic conductive film;
- drying the fifth solution at a temperature of not lower than 60° C. and not higher than 80° C. in a nitrogen atmosphere for forming a third organic semiconductor film, the third organic semiconductor film having a bipolar property or an electron transporting property;
- removing a part of the third organic semiconductor film;
- forming a second electrode on a part of the exposed organic conductive film, wherein the second electrode does not overlap the first electrode; and
- forming a third electrode on the third organic semiconductor film, wherein the third electrode at least partly overlaps the first electrode.

20. The manufacturing method of an organic semiconductor device according to claim 19, wherein the organic conductive film is not thinner than 1 nm and not thicker than 30 nm.

21. The manufacturing method of an organic semiconductor device according to claim 19, wherein an organic compound contained in the second solution is identical to an organic compound contained in the fifth solution.

22. The manufacturing method of an organic semiconductor device according to claim 19, wherein hexane or heptane is used as the third solution.

23. The manufacturing method of an organic semiconductor device according to claim 19, wherein the second solution and the fifth solution contain poly[2-methoxy-5-(2'-ethylhexyloxy)-1,4-phenylenevinylene], and the fourth solution contains poly (3,4-ethylenedioxythiophene) and polystyrene sulfonate).

24. The manufacturing method of an organic semiconductor device according to claim 19, wherein the first solution, the second solution, the third solution, the fourth solution, and the fifth solution are applied by any one of a droplet discharge method, ink jet deposition, spin coating, and dipping.

* * * * *